(12) United States Patent
Shi et al.

(10) Patent No.: US 11,705,487 B2
(45) Date of Patent: Jul. 18, 2023

(54) TRANSISTORS HAVING REDUCED PARASITICS AND ENHANCED PERFORMANCE

(71) Applicant: SKYWORKS SOLUTIONS, INC., Woburn, MA (US)

(72) Inventors: Yun Shi, San Diego, CA (US); John Tzung-Yin Lee, Costa Mesa, CA (US)

( * ) Notice: Subject to any disclaimer, the term of this patent is extended or adjusted under 35 U.S.C. 154(b) by 0 days.

(21) Appl. No.: 16/872,575

(22) Filed: May 12, 2020

(65) Prior Publication Data

US 2020/0357886 A1 Nov. 12, 2020

Related U.S. Application Data

(60) Provisional application No. 62/846,684, filed on May 12, 2019.

(51) Int. Cl.
*H01L 29/06* (2006.01)
*H01L 29/78* (2006.01)
*H01L 29/10* (2006.01)
*H01L 29/423* (2006.01)

(52) U.S. Cl.
CPC ...... *H01L 29/0696* (2013.01); *H01L 29/1095* (2013.01); *H01L 29/4238* (2013.01); *H01L 29/7841* (2013.01)

(58) Field of Classification Search
CPC ............ H01L 29/0696; H01L 29/0843; H01L 29/0865–0869; H01L 29/0882–0886; H01L 29/0891; H01L 29/1029–1058; H01L 29/41758; H01L 29/42312–42396; H01L 29/49–518; H01L 29/66598; H01L 29/66636; H01L 29/66643; H01L 29/66651; H01L 29/66659; H01L 29/435; H01L 29/66848; H01L 29/8126; H01L 29/7841; H01L 29/1095; H01L 29/4238; H01L 29/7725; H01L 29/775; H01L 29/778; H01L 29/7833–7836; H01L 29/8615; H01L 29/78624; H01L 29/78696; H01L 27/11553; H01L 27/1158; H01L 27/1203; H01L 27/14616
USPC ..... 257/347, 57, 66, 349, 348; 438/165, 981
See application file for complete search history.

(56) References Cited

U.S. PATENT DOCUMENTS

| | | | |
|---|---|---|---|
| 7,504,291 B2 * | 3/2009 | Maeda | H01L 21/84 257/E21.625 |
| 8,937,354 B2 * | 1/2015 | Chen | H01L 29/42384 257/348 |
| 2002/0096719 A1 * | 7/2002 | Dockerty | G06Q 40/02 257/E29.147 |

(Continued)

*Primary Examiner* — Natalia A Gondarenko

(57) ABSTRACT

Transistors having reduced parasitics and enhanced performance. In some embodiments, a transistor can include a source and a drain each implemented as a first type active region, and a gate implemented relative to the source and the drain such that application of a voltage to the gate results in formation of a conductive channel between the source and the drain. The transistor can further include a body configured to provide the conductive channel upon the application of the voltage to the gate. The body can be implemented as a second type active region that butts with the first type active region on the source side at a respective area not covered by the gate, and does not butt with the first type active region on the drain side at a respective area not covered by the gate.

8 Claims, 22 Drawing Sheets

(56) References Cited

U.S. PATENT DOCUMENTS

| | | | |
|---|---|---|---|
| 2002/0125534 A1* | 9/2002 | Kim | H01L 27/1203 257/347 |
| 2005/0001254 A1* | 1/2005 | Hidaka | H01L 27/10897 257/296 |
| 2010/0244135 A1* | 9/2010 | Okihara | H01L 27/1203 257/351 |

* cited by examiner

TRANSISTORS HAVING REDUCED PARASITICS AND ENHANCED PERFORMANCE

CROSS-REFERENCE TO RELATED APPLICATION(S)

This application claims priority to U.S. Provisional Application No. 62/846,684 filed May 12, 2019, entitled TRANSISTORS HAVING REDUCED PARASITICS AND ENHANCED PERFORMANCE, the disclosure of which is hereby expressly incorporated by reference herein in its respective entirety.

BACKGROUND

Field

The present disclosure relates to transistors having reduced parasitics.

Description of the Related Art

Transistors such as field-effect transistors (FETs) can be utilized in a number of electronic applications. Such a transistor typically includes some parasitic effects resulting from, for example, structure and arrangement of various parts of the transistor. In many situations, such parasitic effects can degrade performance of the transistor.

SUMMARY

In some implementations, the present disclosure relates to a transistor that includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate. The body is implemented as a second type active region that butts with the first type active region on the source side at a respective area not covered by the gate, and does not butt with the first type active region on the drain side at a respective area not covered by the gate.

In some embodiments, the first type active region can include an N+ active region, and the second type active region can include a P+ active region.

In some embodiments, the transistor can further include an insulator layer implemented under the body, such that the body is a floating body.

In some embodiments, the transistor can further include a gate oxide layer between the gate and the body.

In some embodiments, the second type active region of the body butting with the first type active region of the source can result in electrical potentials of the source and the body to be approximately same.

In some embodiments, the gate can have a symmetric shape about a line along a width direction of the gate. In some embodiments, the gate can have a rectangular shape dimensioned to allow the butting of the second type active region of the body and the first type active region of the source. The second type active region of the body can include a boundary substantially along the width direction line of the gate. In some embodiments, the gate can have a modified T shape with a shortened extension along a direction perpendicular to the width direction, with the shortened extension of the gate being dimensioned to allow the butting of the second type active region of the body and the first type active region of the source. The second type active region of the body can include a boundary substantially along the width direction line of the gate.

In some embodiments, the gate can have an asymmetric shape about a line along a width direction of the gate. The gate can have a modified L shape with a shortened extension along a direction perpendicular to the width direction, with the shortened extension of the gate being dimensioned to allow the butting of the second type active region of the body and the first type active region of the source. The second type active region of the body can include a boundary that is offset towards the source side from the width direction line of the gate.

In some embodiments, the gate can have first and second ends along a width direction of the gate. In some embodiments, the second type active region of the body that butts with the first type active region on the source side can be implemented on one of the first and second ends of the gate. In some embodiments, the second type active region of the body that butts with the first type active region on the source side can be implemented on each of the first and second ends of the gate.

According to some teachings, the present disclosure relates to a semiconductor die that includes a substrate and one or more transistors implemented on the substrate. Each transistor includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate. The body is implemented as a second type active region that butts with the first type active region on the source side at a respective area not covered by the gate, and does not butt with the first type active region on the drain side at a respective area not covered by the gate.

In some embodiments, the substrate can include a silicon-on-insulator substrate. In some embodiments, each transistor can be configured as a radio-frequency transistor. In some embodiments, each transistor can be configured as a digital cell transistor.

In accordance with a number of implementations, the present disclosure relates to a packaged module that includes a packaging substrate and a semiconductor die mounted on the packaging substrate. The semiconductor die includes one or more transistors, with each transistor including a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate, with the body being implemented as a second type active region that butts with the first type active region on the source side at a respective area not covered by the gate, and does not butt with the first type active region on the drain side at a respective area not covered by the gate.

In some teachings, the present disclosure relates to a transistor that includes a plurality of source regions and a plurality of drain regions arranged in an alternating manner, with each of the source regions and the drain regions being implemented as a first type active region. The transistor further includes a plurality of gate structures implemented relative to the source regions and the drain regions such that application of a voltage to each gate structure results in formation of a conductive channel between a respective pair of source and drain regions. The transistor further includes a body region configured to provide the respective conductive channel upon the application of the voltage to the corresponding gate structure, with the body region being implemented as a second type active region. The transistor further includes a recessed region defined by an end of each drain region and one or both of the gate structures adjacent to the drain region.

In some embodiments, the transistor can further include an insulator layer implemented under the body regions, such that the body regions function as a floating body.

In some embodiments, the transistor can further include a gate oxide layer between each gate structure and the respective body region.

In some embodiments, each first type active region can include an N+ active region, and each second type active region can include a P+ active region. In some embodiments, the N+ active regions can be parts of an N+ implant region, and the P+ active regions can be parts of a P+ implant region. In some embodiments, each recessed region can include a portion of the P+ implant region bordered by two neighboring P+ body regions, and a portion of the N+ implant region bordered by two neighboring gate structures and the end of the respective drain region. The P+ implant region and the N+ implant region can be dimensioned such that the P+ body region under the respective gate structure has a reduced width to reduce parasitic capacitance associated with the gate structure.

In some embodiments, each recessed region can include a portion of an N+ implant region implemented between two neighboring P+ implant regions having the respective P+ body regions, and the end of the respective drain region. Each P+ body region can be dimensioned to include a portion that is not covered by the respective gate structure and having an edge forms a butted P+/N+ interface with a respective N+ source region. The portion of the P+ body region forming the butted P+/N+ interface with the N+ source region can result in electrical potentials of the source region and the body region to be approximately same.

In some embodiments, the transistor can further include another recessed region defined by the other end of each drain region and the one or both of the gate structures adjacent to the drain region.

In a number of implementations, the present disclosure relates to a semiconductor die that includes a substrate and one or more transistors implemented on the substrate. Each transistor includes a plurality of source regions and a plurality of drain regions arranged in an alternating manner, with each of the source regions and the drain regions being implemented as a first type active region. The transistor further includes a plurality of gate structures implemented relative to the source regions and the drain regions such that application of a voltage to each gate structure results in formation of a conductive channel between a respective pair of source and drain regions. The transistor further includes a body region configured to provide the respective conductive channel upon the application of the voltage to the corresponding gate structure, with the body region being implemented as a second type active region. The transistor further includes a recessed region defined by an end of each drain region and one or both of the gate structures adjacent to the drain region.

In some embodiments, the substrate can include a silicon-on-insulator substrate. In some embodiments, each transistor can be configured as a radio-frequency transistor. In some embodiments, each transistor can be configured as a digital cell transistor.

In some implementations, the present disclosure relates to a packaged module that includes a packaging substrate and a semiconductor die mounted on the packaging substrate and including one or more transistors. Each transistor includes a plurality of source regions and a plurality of drain regions arranged in an alternating manner, with each of the source regions and the drain regions being implemented as a first type active region. The transistor further includes a plurality of gate structures implemented relative to the source regions and the drain regions such that application of a voltage to each gate structure results in formation of a conductive channel between a respective pair of source and drain regions. The transistor further includes a body region configured to provide the respective conductive channel upon the application of the voltage to the corresponding gate structure, with the body region being implemented as a second type active region. The transistor further includes a recessed region defined by an end of each drain region and one or both of the gate structures adjacent to the drain region.

In some teachings, the present disclosure relates to a transistor that includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate, with the body being implemented as a second type active region, and the gate defining an opening dimensioned to allow a contact with the body to reduce parasitic capacitance associated with the gate.

In some embodiments, the first type active region can include an N+ active region, and the second type active region can include a P+ active region. In some embodiments, the gate can have first and second ends along a width direction of the gate. In some embodiments, the second type active region of the body and the respective opening of the gate can be implemented on one of the first and second ends of the gate. In some embodiments, the second type active region of the body and the respective opening of the gate can be implemented on each of the first and second ends of the gate.

In accordance with some teachings, the present disclosure relates to a semiconductor die that includes a substrate and one or more transistors implemented on the substrate. Each transistor includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate, with the body being implemented as a second type active region, and the gate defining an opening dimensioned to allow a contact with the body to reduce parasitic capacitance associated with the gate.

In a number of implementations, the present disclosure relates to a packaged module that includes a packaging substrate and a semiconductor die mounted on the packaging substrate and including one or more transistors. Each transistor includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate, with the body being implemented as a second type active region, and the gate defining an opening dimensioned to allow a contact with the body to reduce parasitic capacitance associated with the gate.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
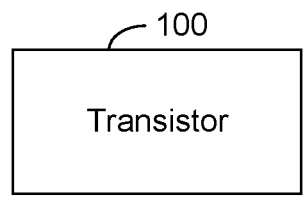
FIG. 1 depicts a transistor having one or more features as described herein.
Figure 2:
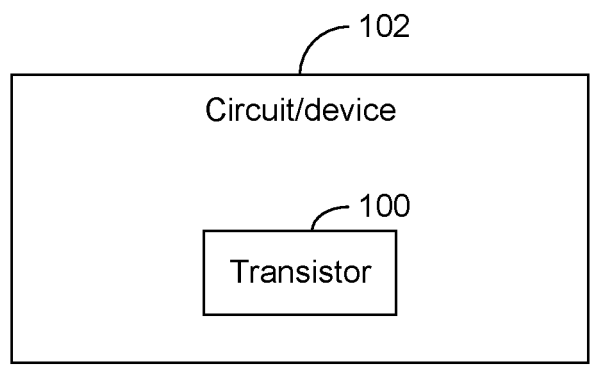
FIG. 2 shows that in some embodiments, the transistor of FIG. 1 can be implemented in a circuit and/or a device.

FIG. 1 depicts a transistor 100 having one or more features as described herein. FIG. 2 shows that in some embodiments, the transistor 100 of FIG. 100 can be implemented in a circuit and/or a device 102. Accordingly, the circuit/device 102 can benefit from the one or more features of the transistor 100. Examples related to such a transistor and related circuit/device are described herein in greater detail.

In metal-oxide-semiconductor field-effect transistors (MOSFETs) such as silicon-on-insulator (SOI) transistors, a floating-body (FB) configuration can provide lower parasitics (e.g., parasitic capacitance) than a body-connected (BC) configuration. Thus, FB SOI transistors tend to provide better performance than BC SOI transistors. However, the floating-body effect can limit practical applications of FB SOI transistors.

Figure 3:
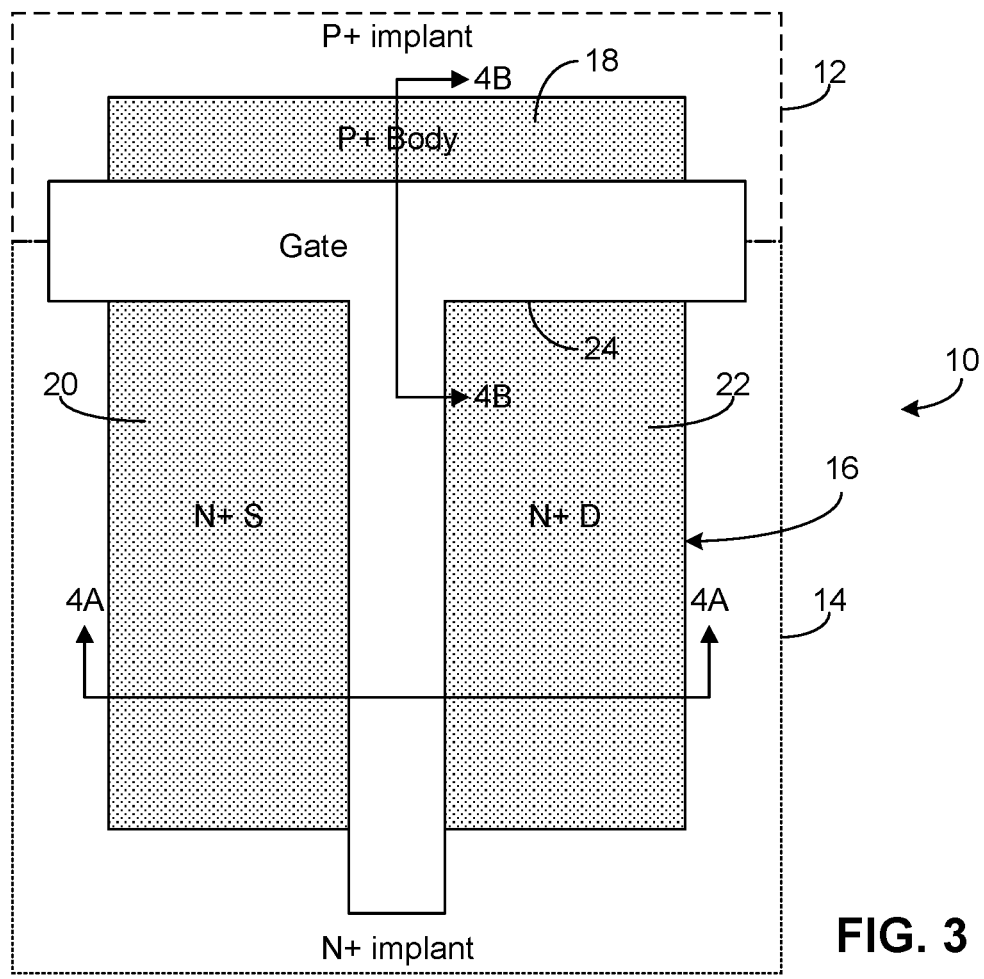
FIG. 3 shows an example of a silicon-on-insulator (SOI) transistor having a floating body configuration.
Figures 4A, 4B:
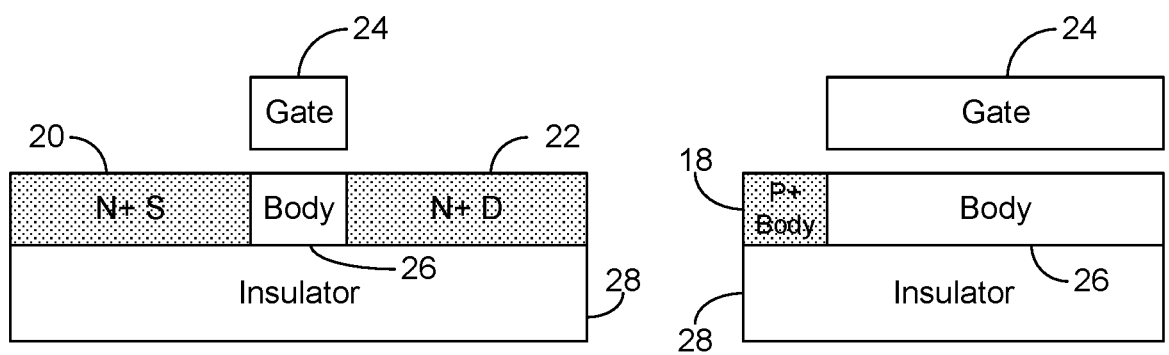
FIG. 4A shows a sectional view as indicated in FIG. 3.
FIG. 4B shows another sectional view as indicated in FIG. 3.

FIG. 3 shows an example of a silicon-on-insulator (SOI) transistor 10 having a floating body configuration. FIGS. 4A and 4B show sectional views as indicated in FIG. 3.

In FIGS. 3 and 4, the example transistor 10 is shown to include an N+ implant region 14 and a P+ implant region 12 formed over an insulator layer 28 (e.g., a buried oxide (BOX) layer). The N+ implant region 14 can include an N+ active region 20 and an N+ active region 22. Such active regions can function as source (S) and drain (D) of the transistor 10. The P+ implant region 12 can include a P+ active region 18, and a portion of such an active region can function as a body of the transistor 10.

In the example of FIGS. 3 and 4, a gate structure 24 is shown to be implemented over the foregoing active regions 20, 22, 18. In some embodiments, such a gate can include, for example, polysilicon material. As shown in FIGS. 4A and 4B, a body 26 can be at least partially between the two N+ active regions 20, 22, and can be at least partially under the gate 24. Typically, an insulator layer such as a gate oxide layer can be present between the gate 24 and the body 26.

Figure 5:
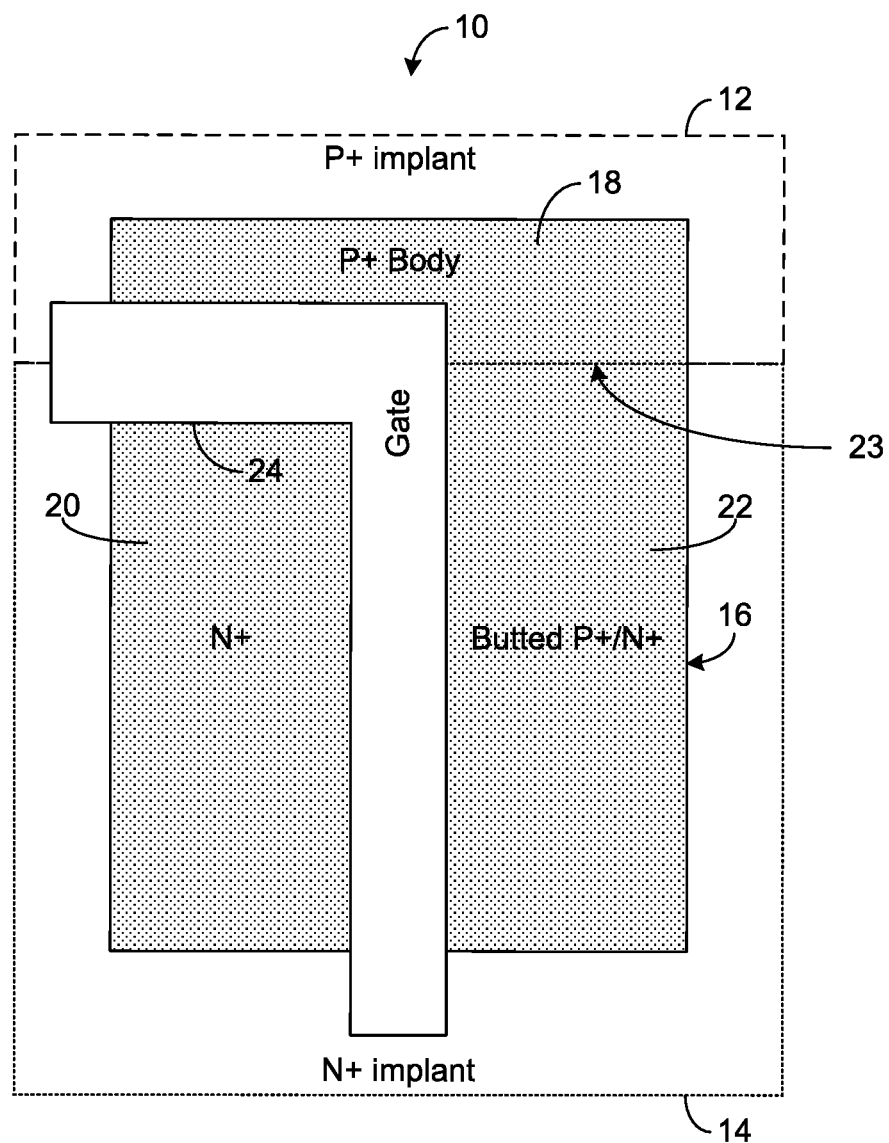
FIG. 5 shows another example of a silicon-on-insulator (SOI) transistor having a floating body configuration, and an L-shape gate.

FIG. 3 shows an example where the gate 24 has a T-shape. FIG. 5 shows another example of a silicon-on-insulator (SOI) transistor 10 having a floating body configuration, and an L-shape gate 24. In the example of FIG. 5, the example transistor 10 is shown to include an N+ implant region 14 and a P+ implant region 12 formed over an insulator layer (e.g., 28 in FIG. 4A) (e.g., a buried oxide (BOX) layer). The N+ implant region 14 can include an N+ active region 20 and an N+ active region 22. Such active regions can function as source (S) and drain (D) of the transistor 10. The P+ implant region 12 can include a P+ active region 18, and a portion of such an active region can function as a body of the transistor 10.

In the example of FIG. 5, the L-shaped gate structure 24 is shown to be implemented over the foregoing active regions 20, 22, 18. In some embodiments, such a gate can include, for example, polysilicon material. Similar to the example of FIG. 3, a body can be at least partially between the two N+ active regions 20, 22, and can be at least partially under the gate 24. Typically, an insulator layer such as a gate oxide layer can be present between the gate 24 and the body.

In the example of FIG. 5, the P+ active area 18 and the N+ active area 22 can be butted with each other generally along an interface 23. With such a configuration, and assuming that the N+ active area 22 is configured as a source (S), the source (S) and the body (B) can have a common potential so as to provide $V_{SB}=0$ across the butted P+/N+ interface 23.

In the example of FIG. 5, it is noted that the P+ implant region 12 extends from the N+ active region 22 (butted) to the N+ active region 20 (not butted).

It is noted that in the examples of FIGS. 3-5, parasitic capacitances (e.g., gate capacitance Cgg) associated with the T-shape and L-shape gates can be about two or three times an intrinsic parasitic capacitance associated with the transistors. Accordingly, such parasitic capacitances Cgg can lead to undesirable effects such as, for example, reduced speed in digital cell applications, and increased loss in radio-frequency (RD) applications.

In some embodiments, the present disclosure relates to a transistor having a P+ implant region implemented on one side of a gate, and the corresponding region on the other side of the gate being a non-P+ implant region.

Figure 6:
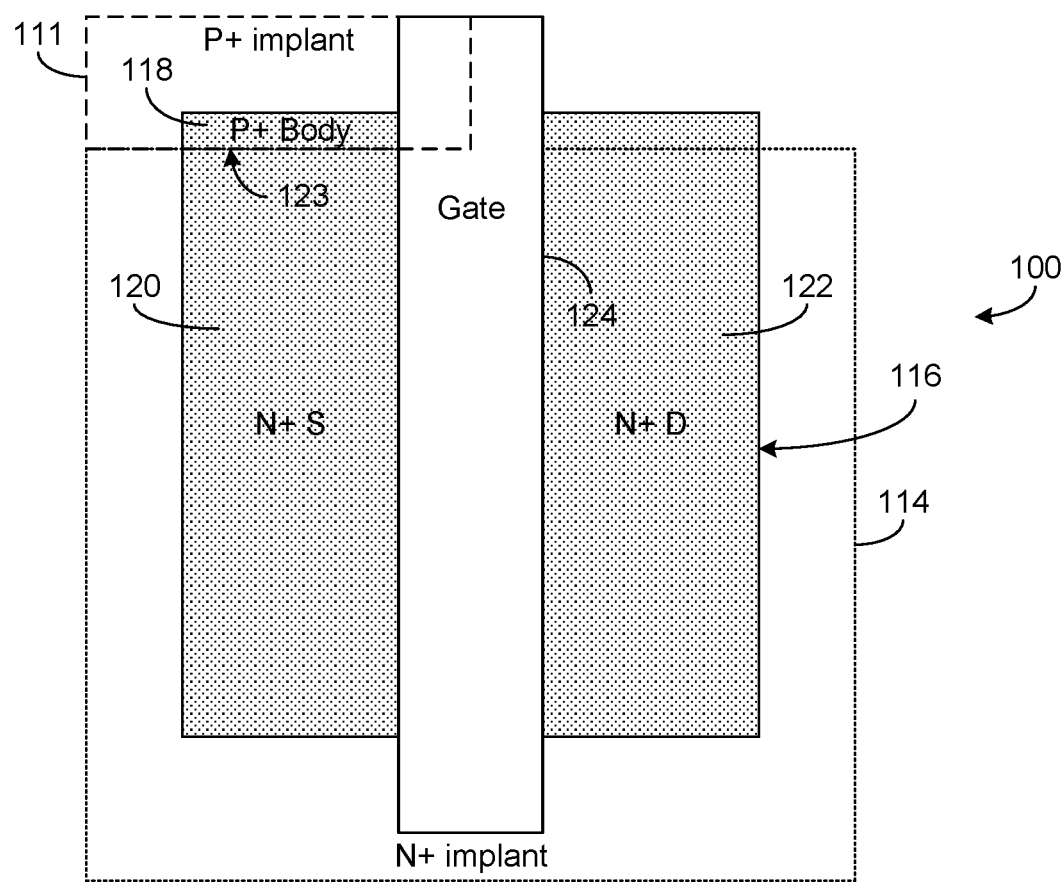
FIG. 6 shows a silicon-on-insulator (SOI) transistor having an active region and an N+ implant region.

For example, FIG. 6 shows a silicon-on-insulator (SOI) transistor 100 having an active region 116 and an N+ implant region 114. In some embodiments, a P+ implant region 111 can be formed on a first side of a gate 124, but not on the other side. The N+ implant region 114 can include a first N+ active region 120 and a second N+ active region 122. Such active regions can function as source (S) and drain (D) of the transistor 100. The P+ implant region 111 can include a P+ active region 118, and a portion of such an active region can function as a body of the transistor 100. Thus, the P+ body 118 is implemented on the first side (e.g., the source side associated with the N+ active region 120), but not on the other side (e.g., the drain side associated with the N+ active region 122).

In the example of FIG. 6, the gate structure 124 is shown to be implemented as a rectangular shape. In some embodiments, such a gate can include, for example, polysilicon material. A body which is coupled to the P+ body 118 can be at least partially between the two N+ active regions 120, 122, and can be at least partially under the gate 124. Typically, an insulator layer such as a gate oxide layer can be present between the gate 124 and the body.

In the example of FIG. 6, the P+ active area 118 and the first N+ active area 120 can be butted with each other generally along an interface 123. With such a configuration, and assuming that the first N+ active region 120 is configured as a source (S), the source (S) and the body (B) can have a common potential so as to provide $V_{SB}=0$ across the butted P+/N+ interface 123. Such a configuration can remove or reduce parasitic capacitance Cgg associated with the gate 124.

Figure 7:
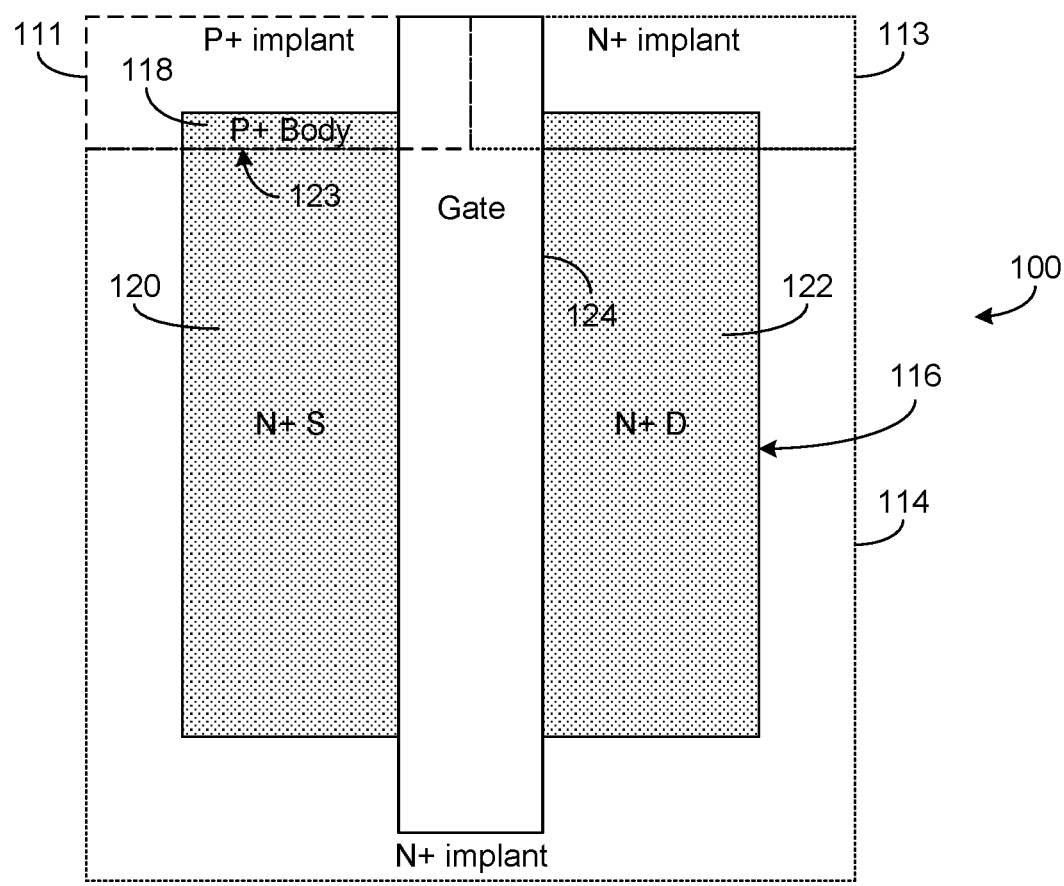
FIG. 7 shows that in some embodiments, a region opposing the P+ implant region of FIG. 6 can be implemented as an N+ implant region.

FIG. 7 shows that in some embodiments, a region opposing the P+ implant region 111 of FIG. 6 (and on the side of the second N+ active region 122) can be implemented as an N+ implant region 113. Such an N+ implant region (113) can be contiguous with the N+ implant region 114, be formed separately, or some combination thereof. In the example of FIG. 7, other portions of the transistor 100 can be similar to the example of FIG. 6.

Figure 8:
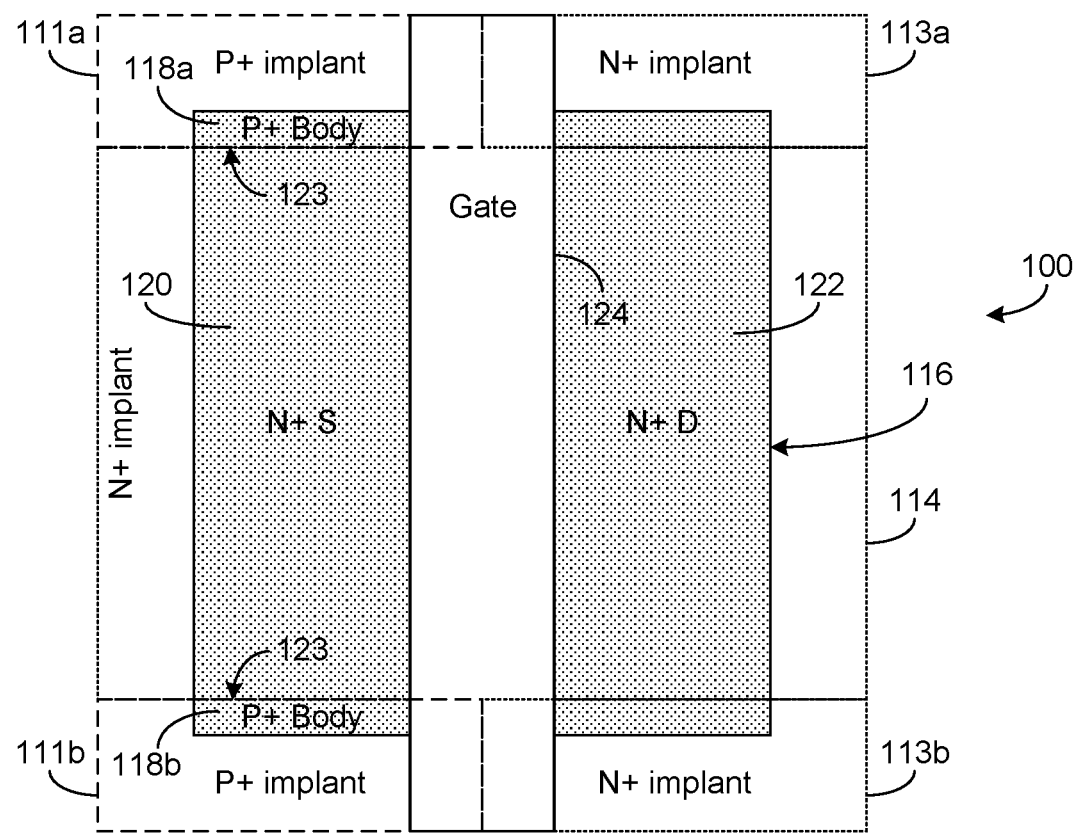
FIG. 8 shows that in some embodiments, a transistor can be similar to the example of FIG. 7, but with a P+ implant region on each of the two ends of the gate.

In the examples of FIGS. 6 and 7, the butted P+/N+ interface 123 on one side of the rectangular shaped gate 124 is implemented on one end of the gate. FIG. 8 shows that in some embodiments, a transistor 100 can include a butted P+/N+ interface 123 on one side of a gate 124 for each of both ends of the gate. For example, in FIG. 8, the transistor 100 can be similar to the example of FIG. 7, but with a P+ implant region on each of the two ends of the gate 124. More particularly, a first P+ implant region 111a can include a first P+ active region 118a, and a portion of such an active region can function as a body of the transistor 100. Thus, the first P+ body 118a is implemented on the first side (e.g., the source side associated with the N+ active region 120), but not on the other side (e.g., the drain side associated with the N+ active region 122). Similarly, a second P+ implant region 111b can include a second P+ active region 118b, and a portion of such an active region can function as a body of the transistor 100.

In the examples of FIGS. 6-8, the rectangular shaped gate allows for the respective butted P+/N+ interfaces (123). FIGS. 9-14 show examples of transistors with gate shapes that are different than the rectangular shaped gates of FIGS. 6-8.

Figure 9:
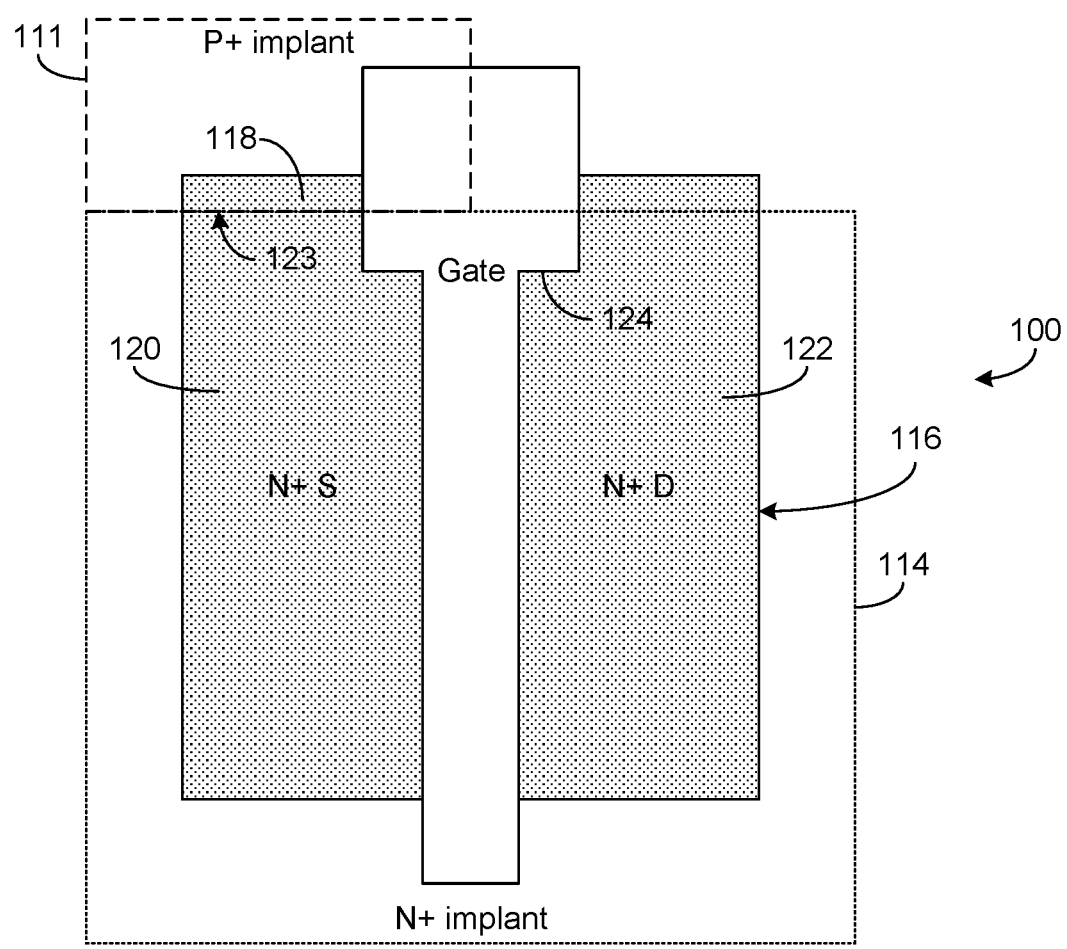
FIG. 9 shows a transistor having a modified T-shape gate with a shortened extension to allow a butted P+/N+ interface on one side of the gate.

For example, FIG. 9 shows a transistor 100 (e.g., an SOI transistor) having a modified T-shape gate 124 with a shortened extension (sideway when viewed as depicted in FIG. 9) to allow a butted P+/N+ interface 123 on one side of the gate 124. The transistor 100 is shown to include an active region 116 and an N+ implant region 114. In some embodiments, a P+ implant region 111 can be formed on a first side of a gate 124, but not on the other side. The N+ implant region 114 can include a first N+ active region 120 and a second N+ active region 122. Such active regions can function as source (S) and drain (D) of the transistor 100. The P+ implant region 111 can include a P+ active region 118, and a portion of such an active region can function as a body of the transistor 100. Thus, the P+ body 118 is implemented on the first side (e.g., the source side associated with the N+ active region 120), but not on the other side (e.g., the drain side associated with the N+ active region 122).

In the example of FIG. 9, the gate structure 124 is shown to be implemented as a modified T-shape. In some embodiments, such a gate can include, for example, polysilicon material. A body which is coupled to the P+ body 118 can be at least partially between the two N+ active regions 120, 122, and can be at least partially under the gate 124. Typically, an insulator layer such as a gate oxide layer can be present between the gate 124 and the body.

In the example of FIG. 9, the P+ active area 118 and the first N+ active area 120 can be butted with each other generally along an interface 123. In some embodiments, such a butted P+/N+ interface 123 is not covered by the gate 124.

With the foregoing configuration, and assuming that the first N+ active region 120 is configured as a source (S), the source (S) and the body (B) can have a common potential so as to provide $V_{SB}=0$ across the butted P+/N+ interface 123. Such a configuration can remove or reduce parasitic capacitance Cgg associated with the gate 124.

Figure 10:
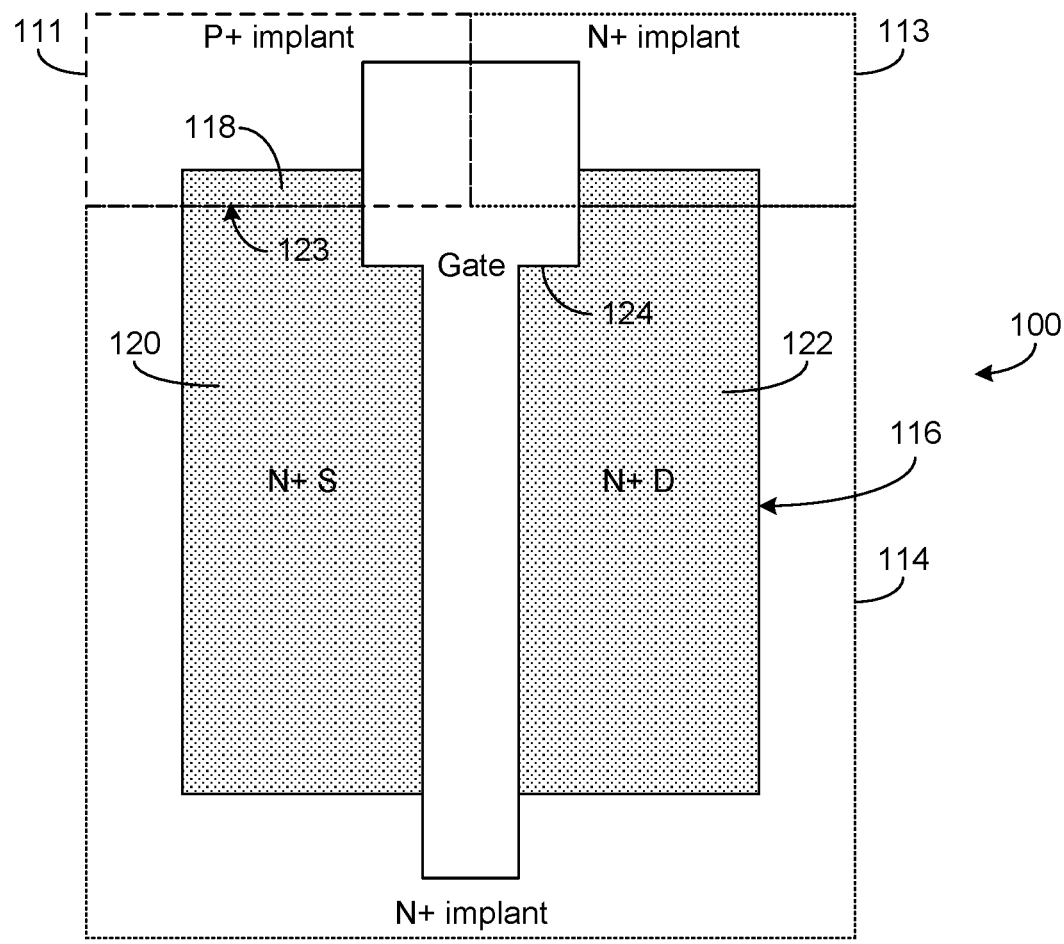
FIG. 10 shows that in some embodiments, a region opposing the P+ implant region of FIG. 9 can be implemented as an N+ implant region.

FIG. 10 shows that in some embodiments, a region opposing the P+ implant region 111 of FIG. 9 (and on the side of the second N+ active region 122) can be implemented as an N+ implant region 113. Such an N+ implant region (113) can be contiguous with the N+ implant region 114, be formed separately, or some combination thereof. In the example of FIG. 10, other portions of the transistor 100 can be similar to the example of FIG. 9.

Figure 11:
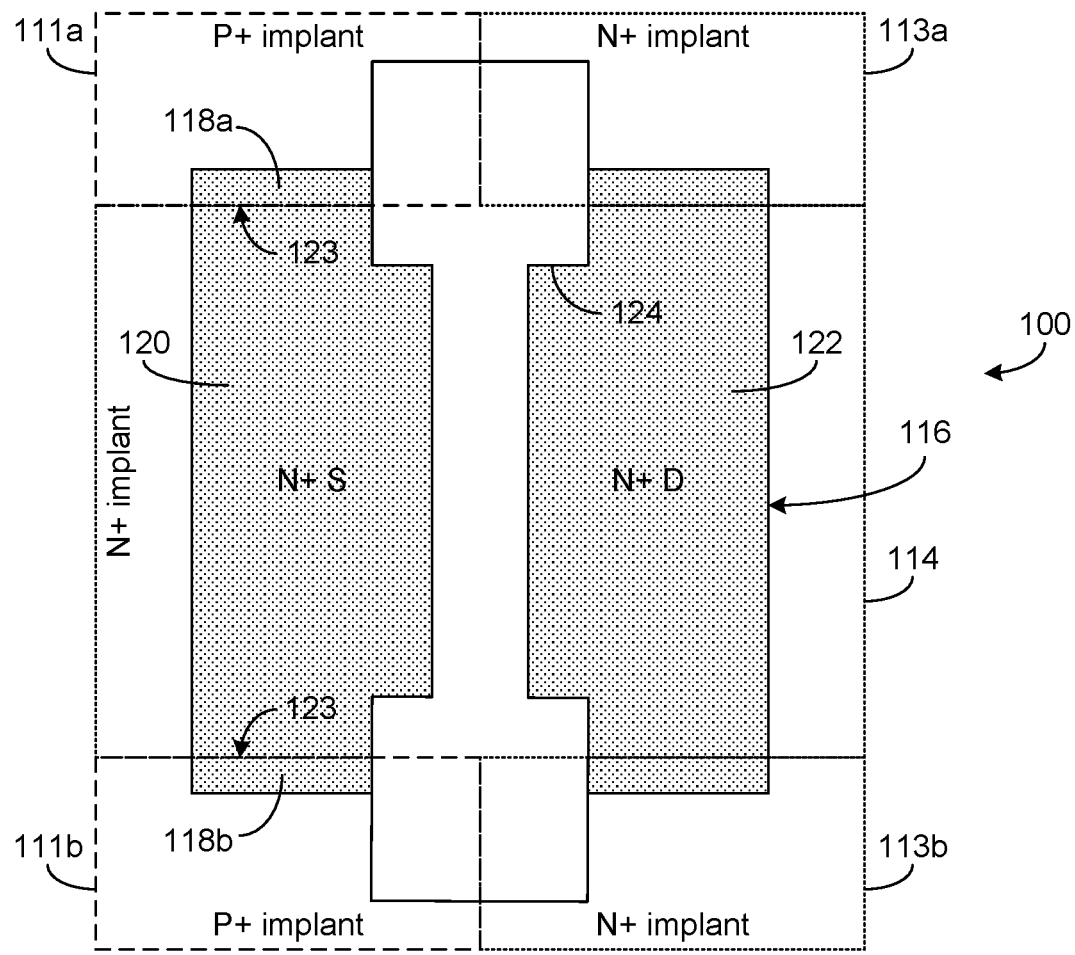
FIG. 11 shows that in some embodiments, a transistor can include a butted P+/N+ interface on one side of a gate for each of both ends of the gate.

In the examples of FIGS. 9 and 10, the butted P+/N+ interface 123 on one side of the modified T-shaped gate 124 is implemented on one end of the gate. FIG. 11 shows that in some embodiments, a transistor 100 can include a butted P+/N+ interface 123 on one side of a gate for each of both ends of the gate. For example, in FIG. 11, the transistor 100 can be similar to the example of FIG. 10, but with a P+ implant region on each of the two ends of the gate 124. More particularly, a first P+ implant region 111a can include a first P+ active region 118a, and a portion of such an active region can function as a body of the transistor 100. Thus, the first P+ body 118a is implemented on the first side (e.g., the source side associated with the N+ active region 120), but not on the other side (e.g., the drain side associated with the N+ active region 122). Similarly, a second P+ implant region 111b can include a second P+ active region 118b, and a portion of such an active region can function as a body of the transistor 100.

Figure 12:
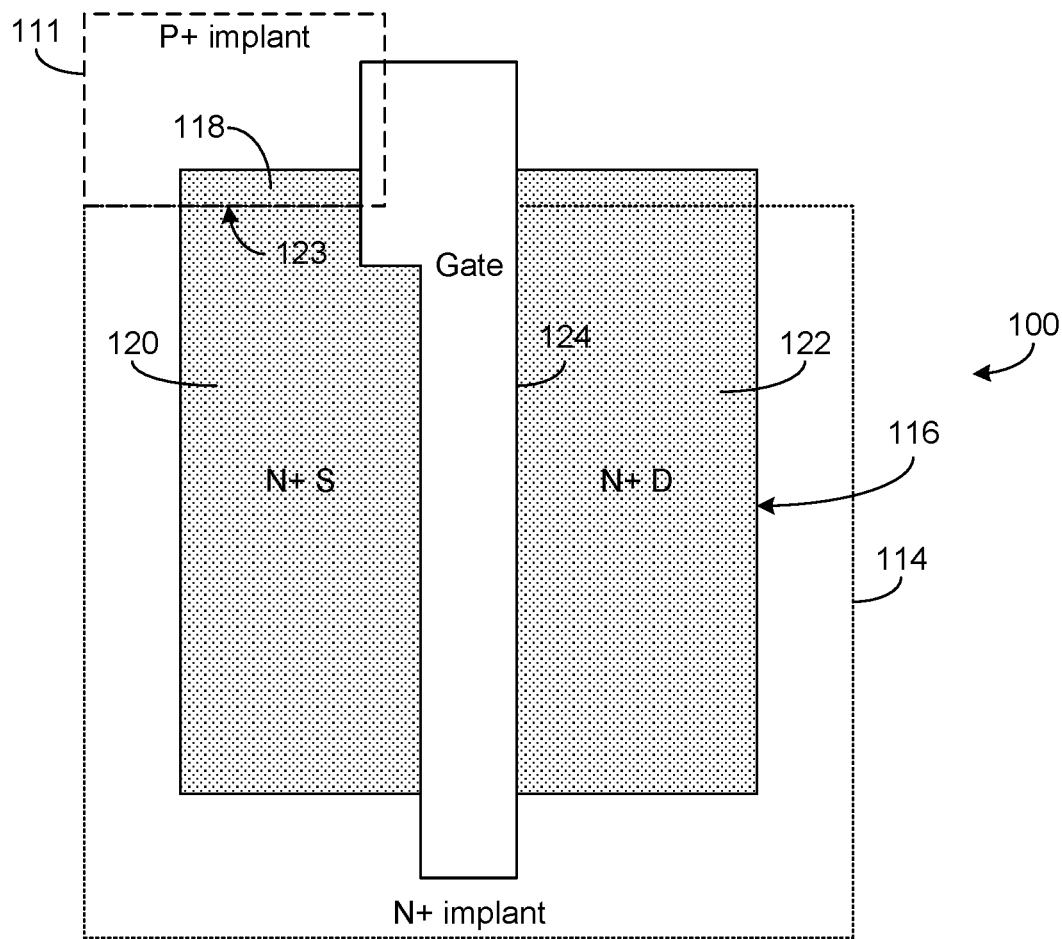
FIG. 12 shows a transistor having a modified L-shape gate with a shortened extension to allow a butted P+/N+ interface on one side of the gate.

In another example, FIG. 12 shows a transistor 100 (e.g., an SOI transistor) having a modified L-shape gate 124 with a shortened extension (sideway to the left when viewed as depicted in FIG. 12) to allow a butted P+/N+ interface 123 on one side of the gate 124. The transistor 100 is shown to include an active region 116 and an N+ implant region 114. In some embodiments, a P+ implant region 111 can be formed on a first side of a gate 124, but not on the other side. The N+ implant region 114 can include a first N+ active region 120 and a second N+ active region 122. Such active regions can function as source (S) and drain (D) of the transistor 100. The P+ implant region 111 can include a P+ active region 118, and a portion of such an active region can function as a body of the transistor 100. Thus, the P+ body 118 is implemented on the first side (e.g., the source side associated with the N+ active region 120), but not on the other side (e.g., the drain side associated with the N+ active region 122).

In the example of FIG. 12, the gate structure 124 is shown to be implemented as a modified L-shape. In some embodiments, such a gate can include, for example, polysilicon material. A body which is coupled to the P+ body 118 can be at least partially between the two N+ active regions 120, 122, and can be at least partially under the gate 124. Typically, an insulator layer such as a gate oxide layer can be present between the gate 124 and the body.

In the example of FIG. 12, the P+ active area 118 and the first N+ active area 120 can be butted with each other generally along an interface 123. In some embodiments, such a butted P+/N+ interface 123 is not covered by the gate 124.

With the foregoing configuration, and assuming that the first N+ active region 120 is configured as a source (S), the source (S) and the body (B) can have a common potential so as to provide $V_{SB}=0$ across the butted P+/N+ interface 123. Such a configuration can remove or reduce parasitic capacitance Cgg associated with the gate 124.

Figure 13:
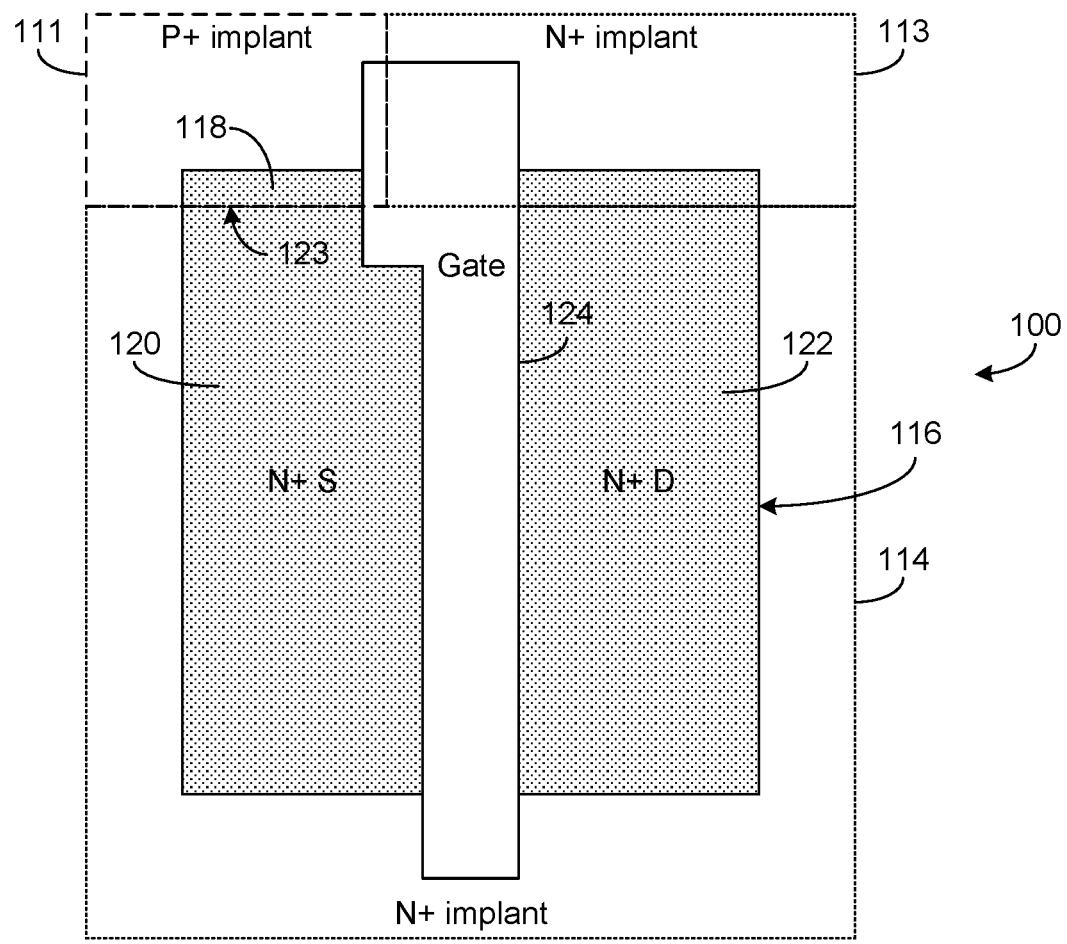
FIG. 13 shows that in some embodiments, a region opposing the P+ implant region of FIG. 12 can be implemented as an N+ implant region.

FIG. 13 shows that in some embodiments, a region opposing the P+ implant region 111 of FIG. 12 (and on the side of the second N+ active region 122) can be implemented as an N+ implant region 113. Such an N+ implant region (113) can be contiguous with the N+ implant region 114, be formed separately, or some combination thereof. In the example of FIG. 13, other portions of the transistor 100 can be similar to the example of FIG. 12.

Figure 14:
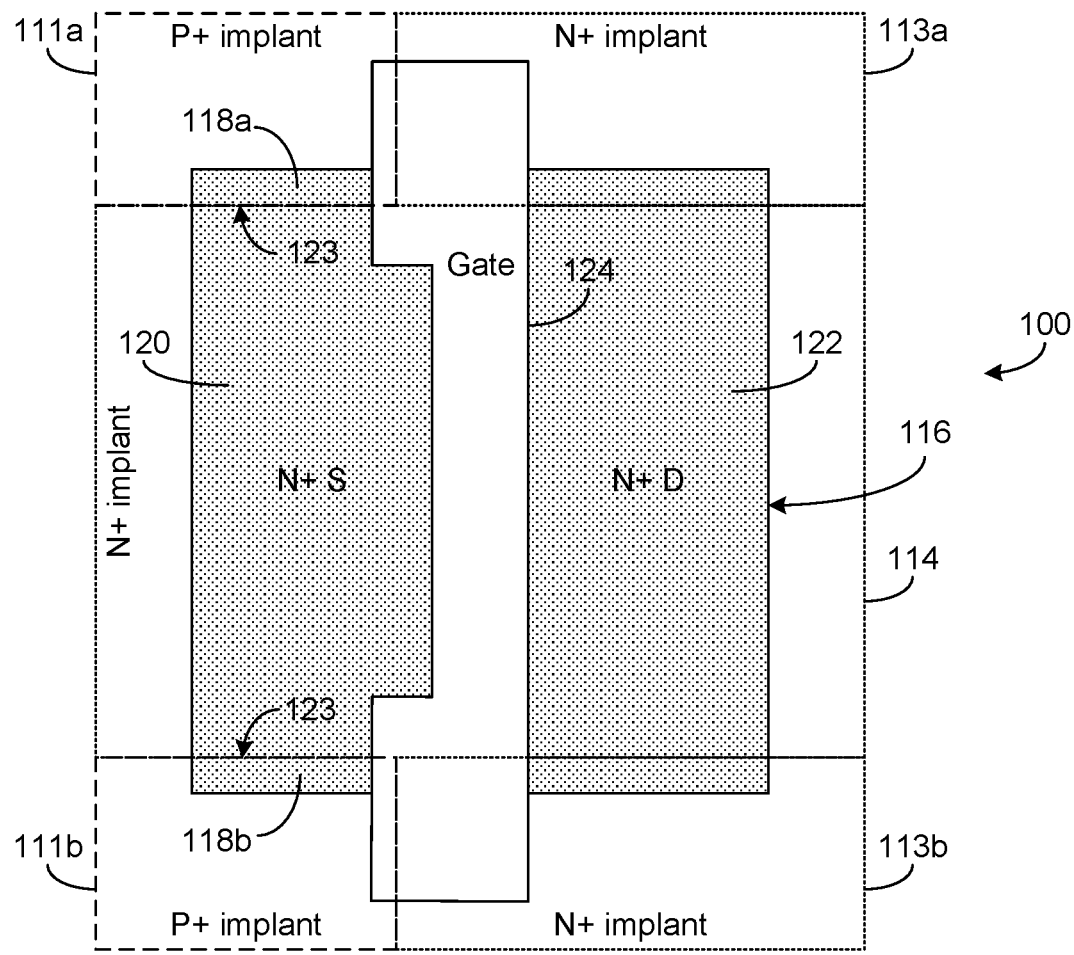
FIG. 14 shows that in some embodiments, a transistor can include a butted P+/N+ interface on one side of a gate for each of both ends of the gate.

In the examples of FIGS. 12 and 13, the butted P+/N+ interface 123 on one side of the modified L-shaped gate 124 is implemented on one end of the gate. FIG. 14 shows that in some embodiments, a transistor 100 can include a butted P+/N+ interface 123 on one side of a gate for each of both ends of the gate. For example, in FIG. 14, the transistor 100 can be similar to the example of FIG. 13, but with a P+ implant region on each of the two ends of the gate 124. More particularly, a first P+ implant region 111a can include a first P+ active region 118a, and a portion of such an active region can function as a body of the transistor 100. Thus, the first P+ body 118a is implemented on the first side (e.g., the source side associated with the N+ active region 120), but not on the other side (e.g., the drain side associated with the N+ active region 122). Similarly, a second P+ implant region 111b can include a second P+ active region 118b, and a portion of such an active region can function as a body of the transistor 100.

In at least some of the examples of FIGS. 12-14, the P+ implant region (111) can be dimensioned and positioned to be on the source side of the respective gate (124). For example, suppose that a middle of the gate 124 is defined along a midline of the strip (vertical strip when viewed as shown in FIGS. 12-14) that separates the source and drain regions 120, 122. With such an assumption, the P+ implant region (111) can be dimensioned and positioned so as to be entirely on the source side of the middle of the gate 124.

Figure 15A:
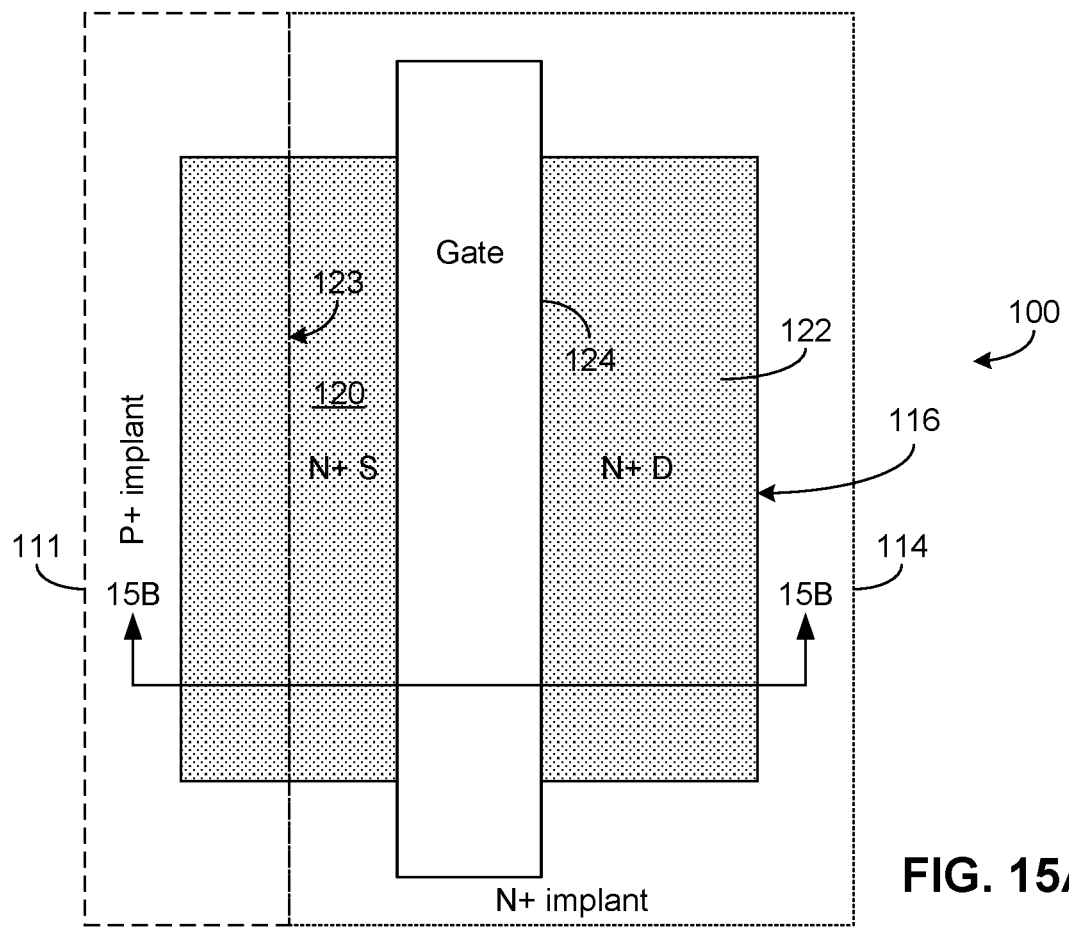
FIGS. 15A and 15B show that in some embodiments, a silicon-on-insulator (SOI) transistor can include an active region and an N+ implant region.
Figure 15B:
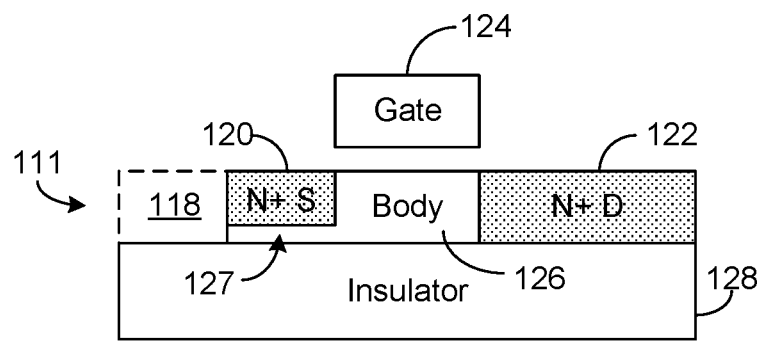

FIGS. 15A and 15B show that in some embodiments, a silicon-on-insulator (SOI) transistor 100 can include an active region 116 and an N+ implant region 114. In some embodiments, a P+ implant region 111 can be formed on a first side of a gate 124, but not on the other side. The N+ implant region 114 can include a first N+ active region 120 and a second N+ active region 122. Such active regions can function as source (S) and drain (D) of the transistor 100. The P+ implant region 111 implemented on the source side can result in a P+ active region 118. The P+ body 118 is implemented appropriately in the foregoing manner can result in a P-link 127 below the N+ active region 120, and such a P-link can provide a coupling to the body under the gate 124.

With the foregoing configuration, and assuming that the first N+ active region 120 is configured as a source (S), the source (S) and the body (B) can have a common potential so as to provide $V_{SB}=0$ across the butted P+/N+ interface 123. Such a configuration can remove or reduce parasitic capacitance Cgg associated with the gate 124.

Figure 16:
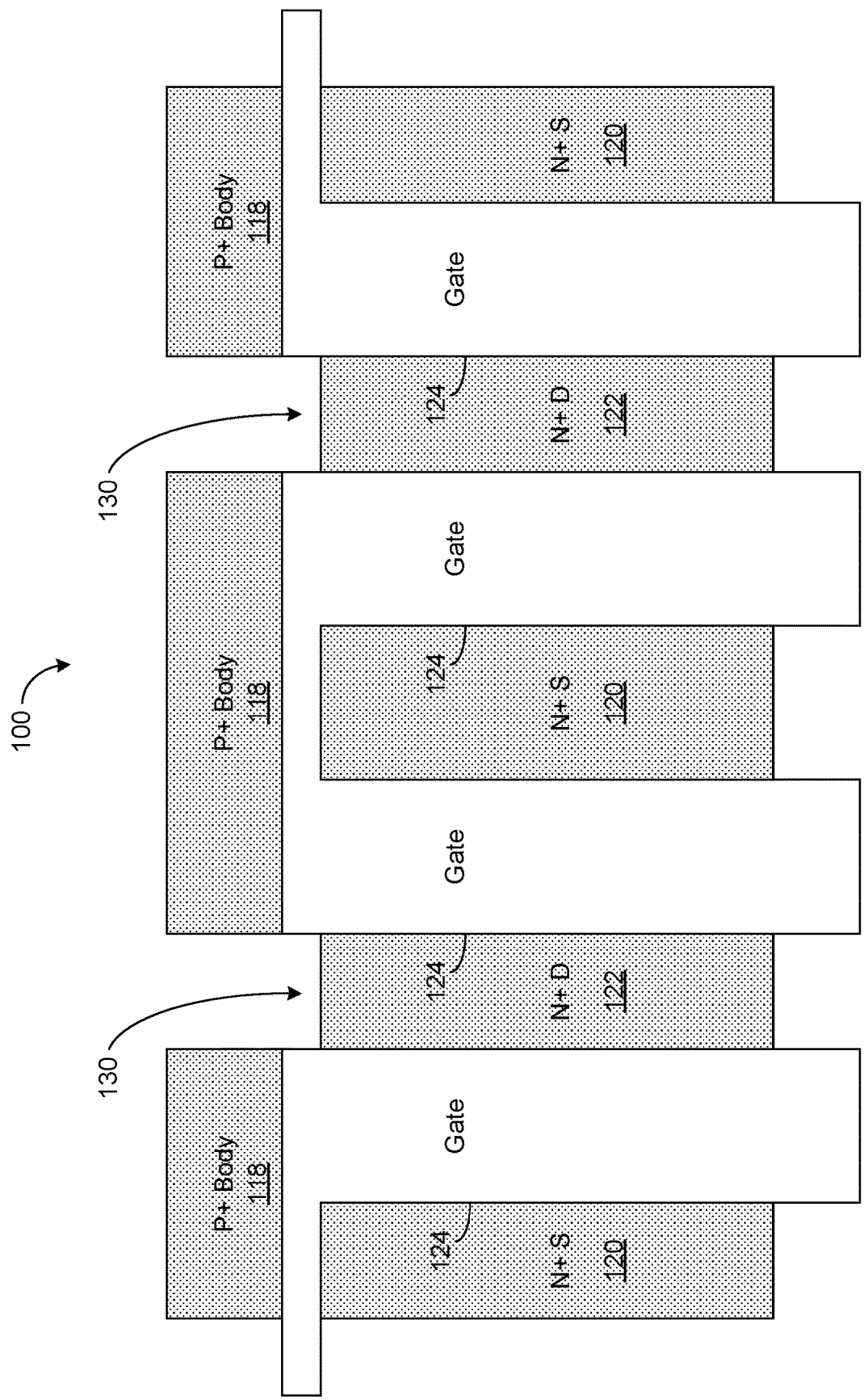
FIG. 16 shows that in some embodiments, a silicon-on-insulator (SOI) transistor can include a plurality of gate structures, and such gate structures can separate alternating source and drain regions.

FIG. 16 shows that in some embodiments, a silicon-on-insulator (SOI) transistor 100 can include a plurality of gate structures 124, and such gate structures can separate alternating source and drain regions. For example, the source regions can be N+ active regions 120, and the drain regions can be N+ active regions 122. Such N+ active regions (120, 122) can be implemented within an N+ implant region.

In the example of FIG. 16, a plurality of P+ body regions 118 can be provided, and such P+ body regions can be implemented as parts of one or more P+ implant regions. In some embodiments, the transistor 100 of FIG. 16 can include recessed regions 130 adjacent the N+ active regions 122 associated with the drains. In some embodiments, each of such recessed regions can be bordered by two neighboring P+ body regions 118, portions of the corresponding pair of gate structures 124, and the respective N+ active region 122. In some embodiments, each recessed region 130 can overlap with either or both of a P+ implant region and an N+ implant region.

Figure 17:
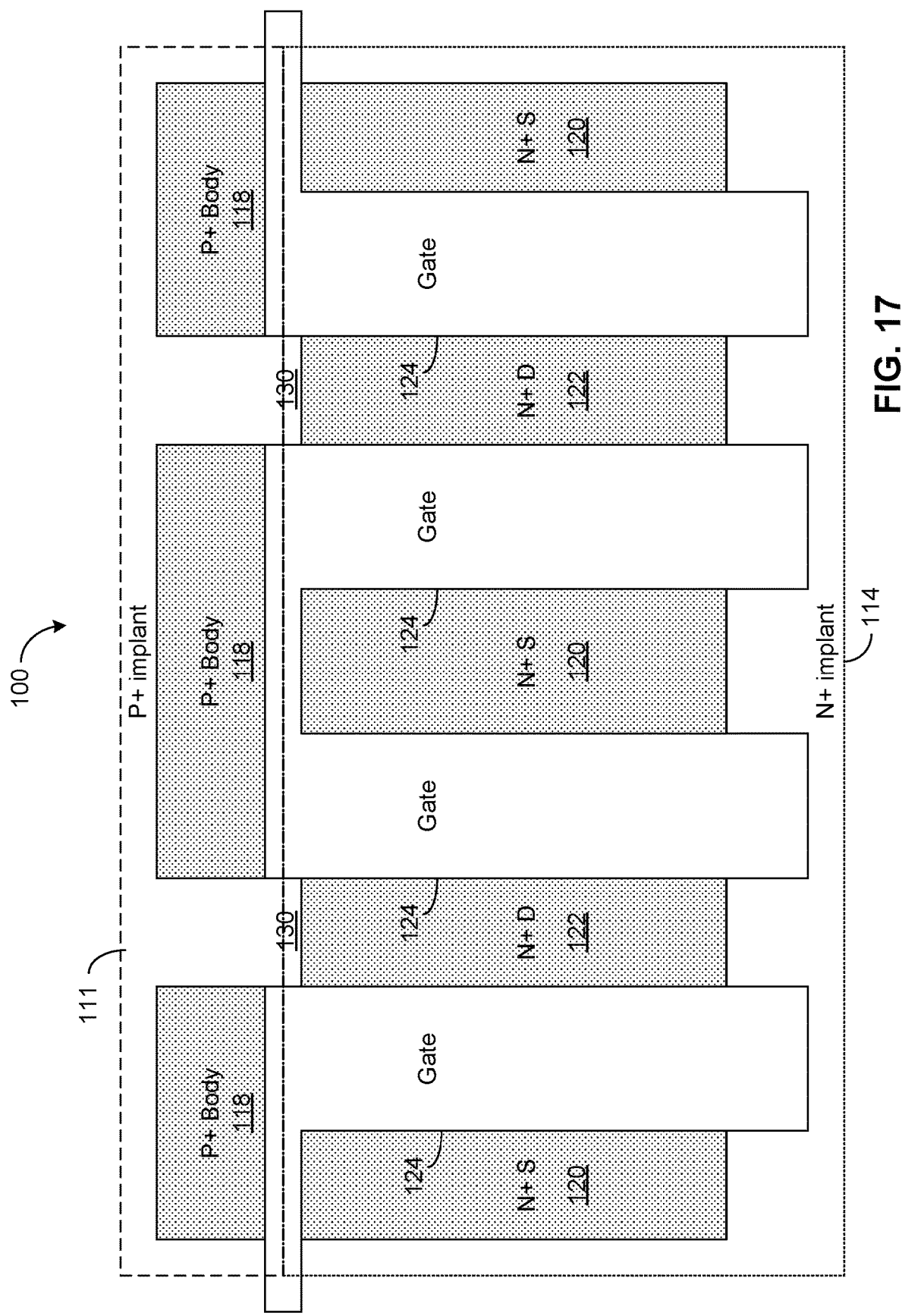
FIG. 17 shows a transistor having gate structures, source regions and drain regions similar to the example FIG. 16.

For example, FIG. 17 shows a transistor 100 (e.g., an SOI transistor) having gate structures 124, source regions 120 and drain regions 122 similar to the example FIG. 16. In the example of FIG. 17, the N+ active regions associated with the sources and drains can be included in an N+ implant region 114, and a P+ implant region 111 can be implemented adjacent to the N+ implant region 114 so as to overlap with all of the P+ body regions 118. Thus, each recessed region 130 can be within the P+ implant region 111, and be bordered by two neighboring P+ body regions 118, portions of the corresponding pair of gate structures 124, and the respective N+ active region 122.

In the example of FIG. 17, the depth of the recessed regions 130 can be selected (e.g., by appropriately dimensioning the P+ implant region 111 and the N+ implant region 114), such that the resulting P+ body regions under the respective portions of the gate structures 124 have minimum or reduced width to reduce parasitic capacitance Cgg associated with the gate 124.

Figure 18:
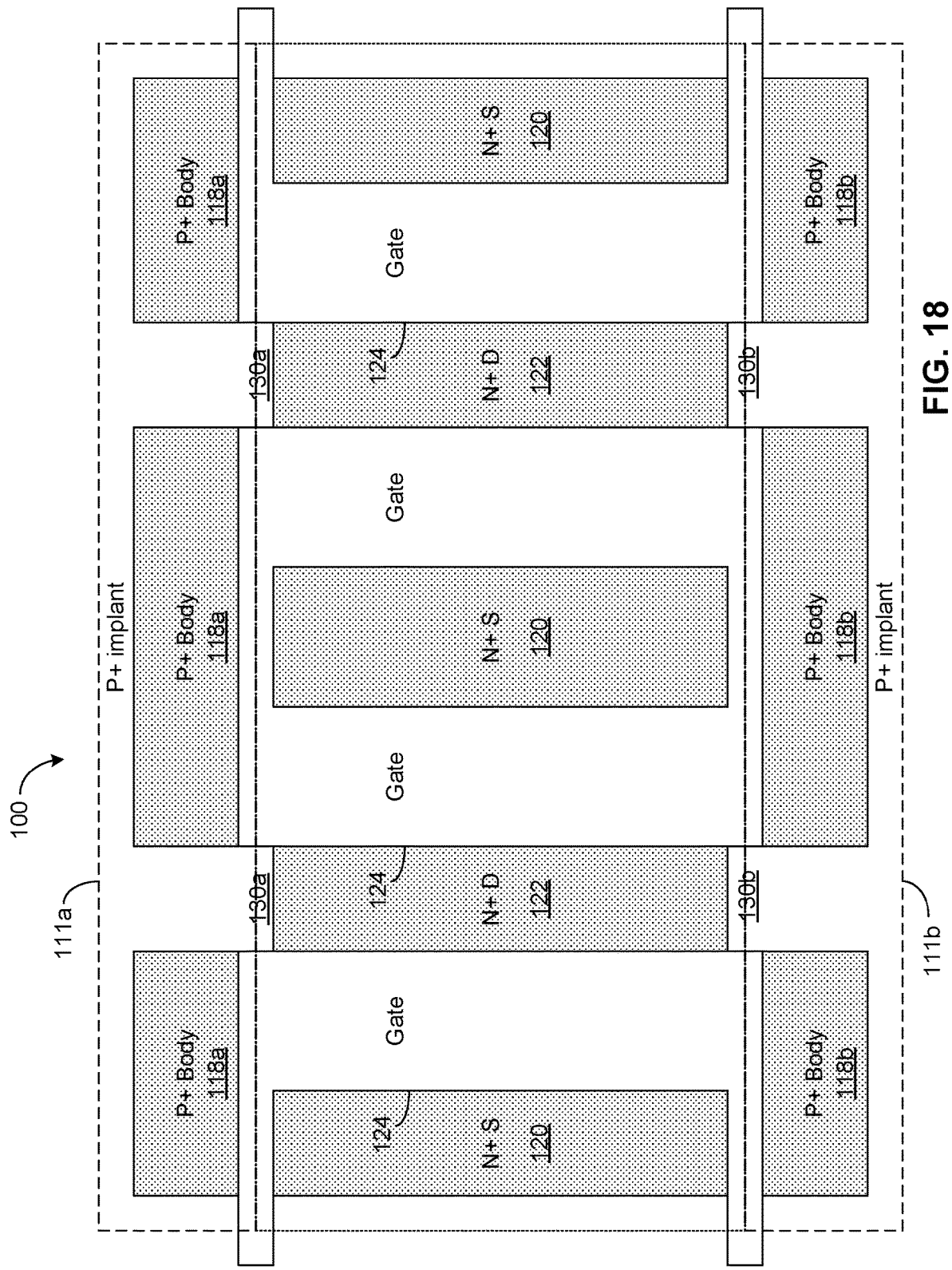
FIG. 18 shows that in some embodiments, a transistor can include recessed regions associated with the drain regions for each of both ends of the gate.

In the example of FIG. 17, the recessed regions 130 associated with the drain regions are implemented on one end of the gate structures 124. FIG. 18 shows that in some embodiments, a transistor 100 can include recessed regions 130 associated with the drain regions for each of both ends of the gate 124.

Figure 19:
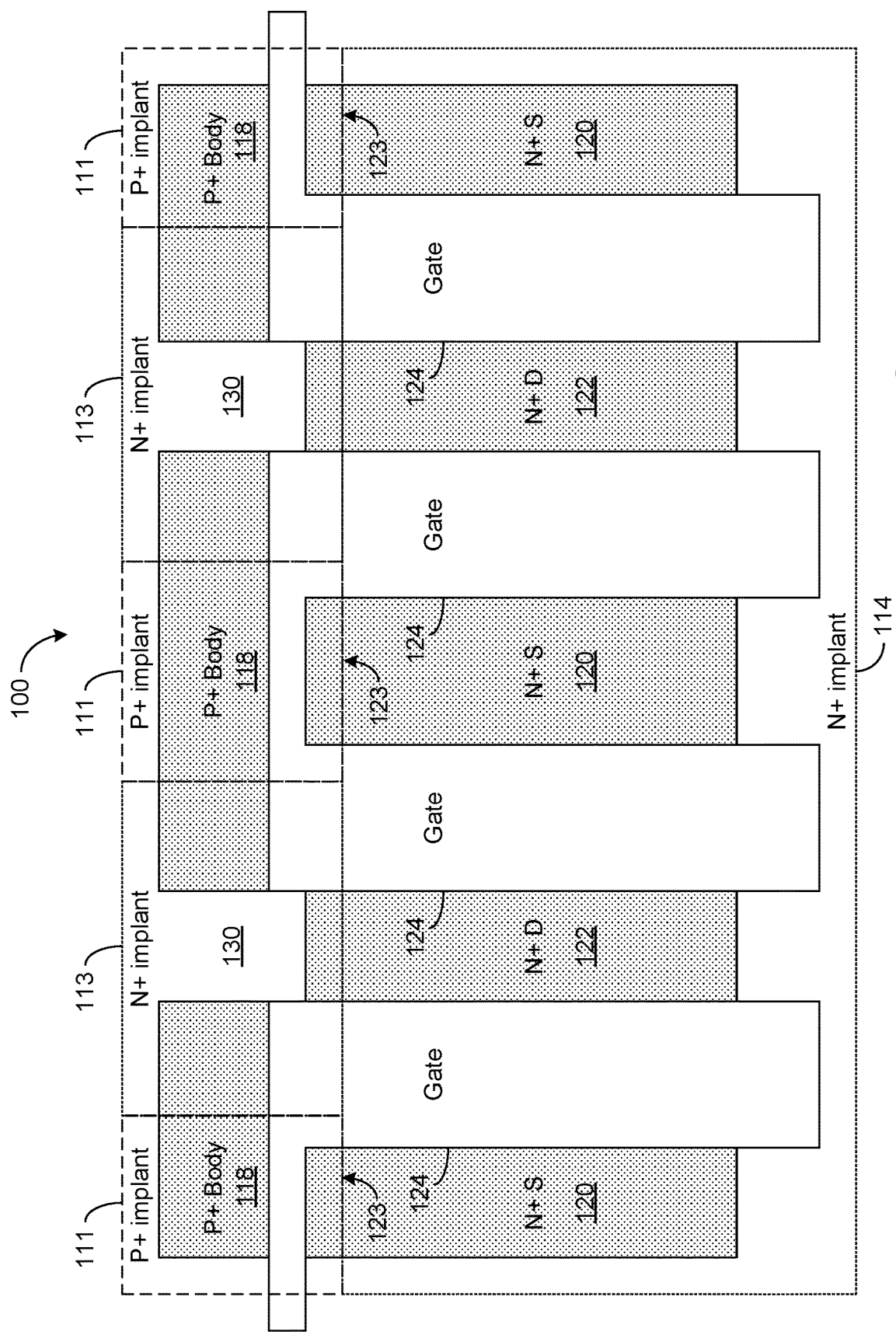
FIG. 19 shows a transistor having gate structures, source regions and drain regions similar to the example FIG. 16.

In another example, FIG. 19 shows a transistor 100 (e.g., an SOI transistor) having gate structures 124, source regions 120 and drain regions 122 similar to the example FIG. 16. In the example of FIG. 19, the N+ active regions associated with the sources and drains can be included in an N+ implant region 114, and the region above the N+ implant region 114 can include alternating P+ implant region 111 and N+ implant region 113. Thus, each recessed region 130 can be within the respective N+ implant region 113.

In the example of FIG. 19, the depth of the recessed regions 130 can be selected (e.g., by appropriately dimensioning the P+ implant region 111, the N+ implant region 113, and the N+ implant region 114) to provide one or more desired functionalities. For example, each P+ implant region 111 can be implemented on the source side of a respective gate structure 124, and be dimensioned to provide a provide a respective butted P+/N+ interface 123 and a corresponding $V_{SB}=0$ across the interface as described herein.

Figure 20:
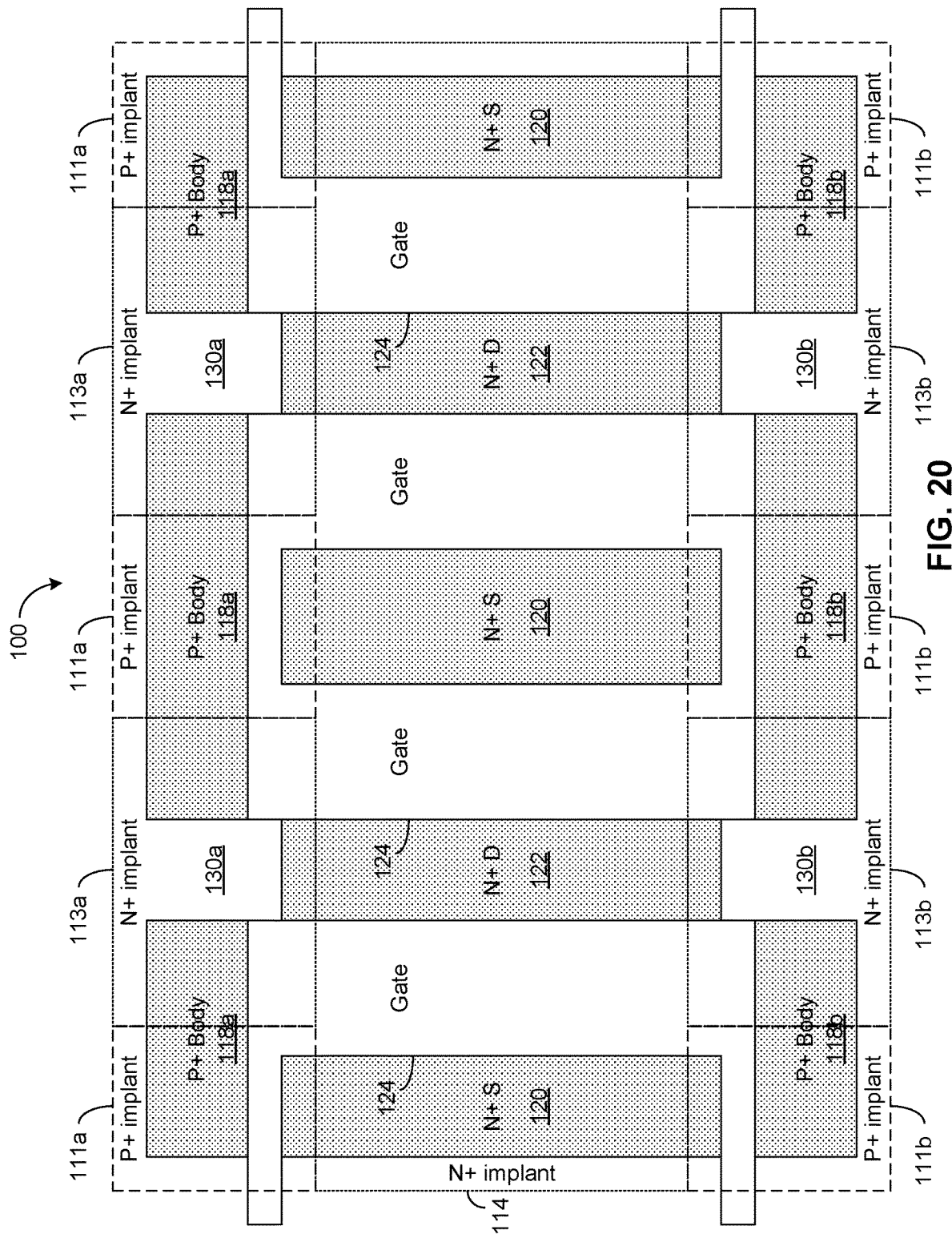
FIG. 20 shows that in some embodiments, a transistor can include recessed regions associated with the drain regions for each of both ends of the gate.

In the example of FIG. 19, the recessed regions 130 associated with the drain regions are implemented on one end of the gate structures 124. FIG. 20 shows that in some embodiments, a transistor 100 can include recessed regions 130 associated with the drain regions for each of both ends of the gate 124.

Figure 21:
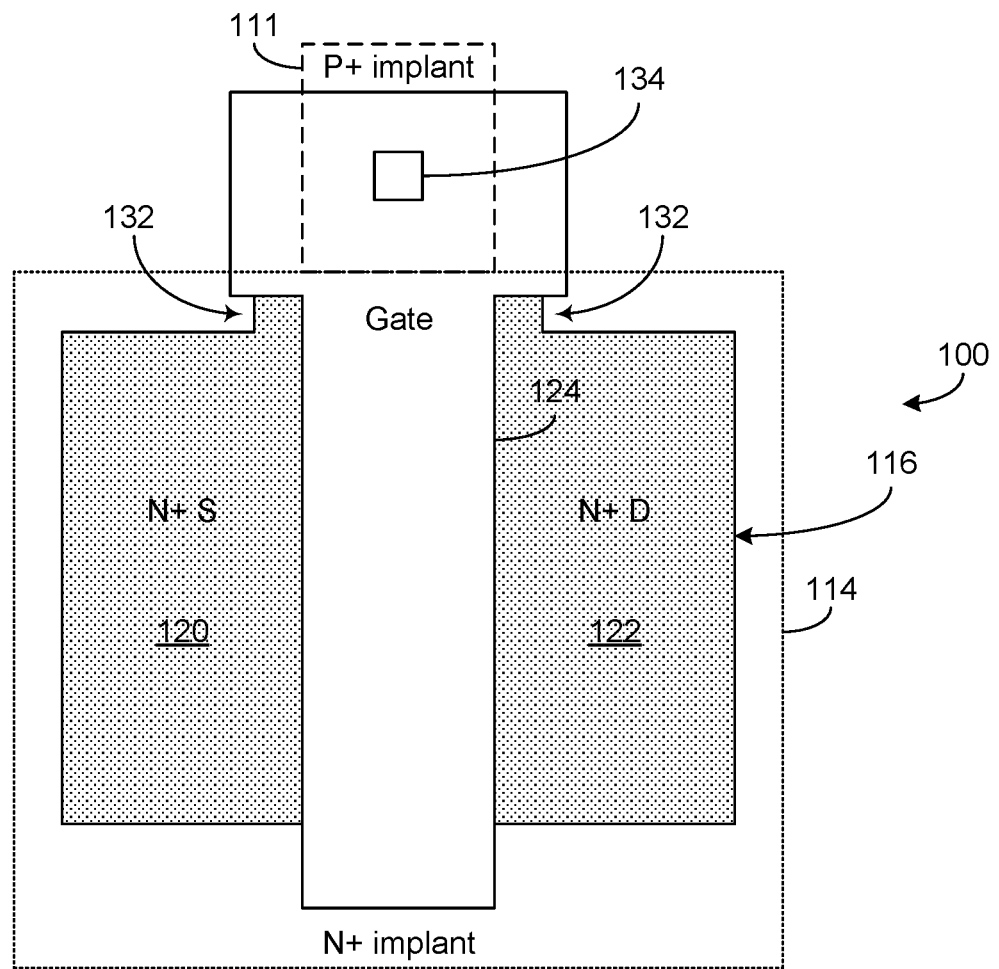
FIG. 21 shows that in some embodiments, a transistor can include a gate such as a T-shape gate.

FIG. 21 shows that in some embodiments, a transistor 100 (e.g., an SOI transistor) can include a gate such as a T-shape gate 124. The transistor 100 is shown to include an active region 116 and an N+ implant region 114. In some embodiments, a P+ implant region 111 can be formed under the gate 124. The N+ implant region 114 can include a first N+ active region 120 and a second N+ active region 122. Such active regions can function as source (S) and drain (D) of the transistor 100. The P+ implant region 111 can include a P+ active region, and a portion of such an active region can function as a body of the transistor 100.

In the example of FIG. 21, an opening 134 such as a hole or a via can be formed through the gate 124 so as to allow contact with the body under the gate 124. Such an opening can be utilized to reduce parasitic capacitance Cgg associated with the gate 124.

Figure 22:
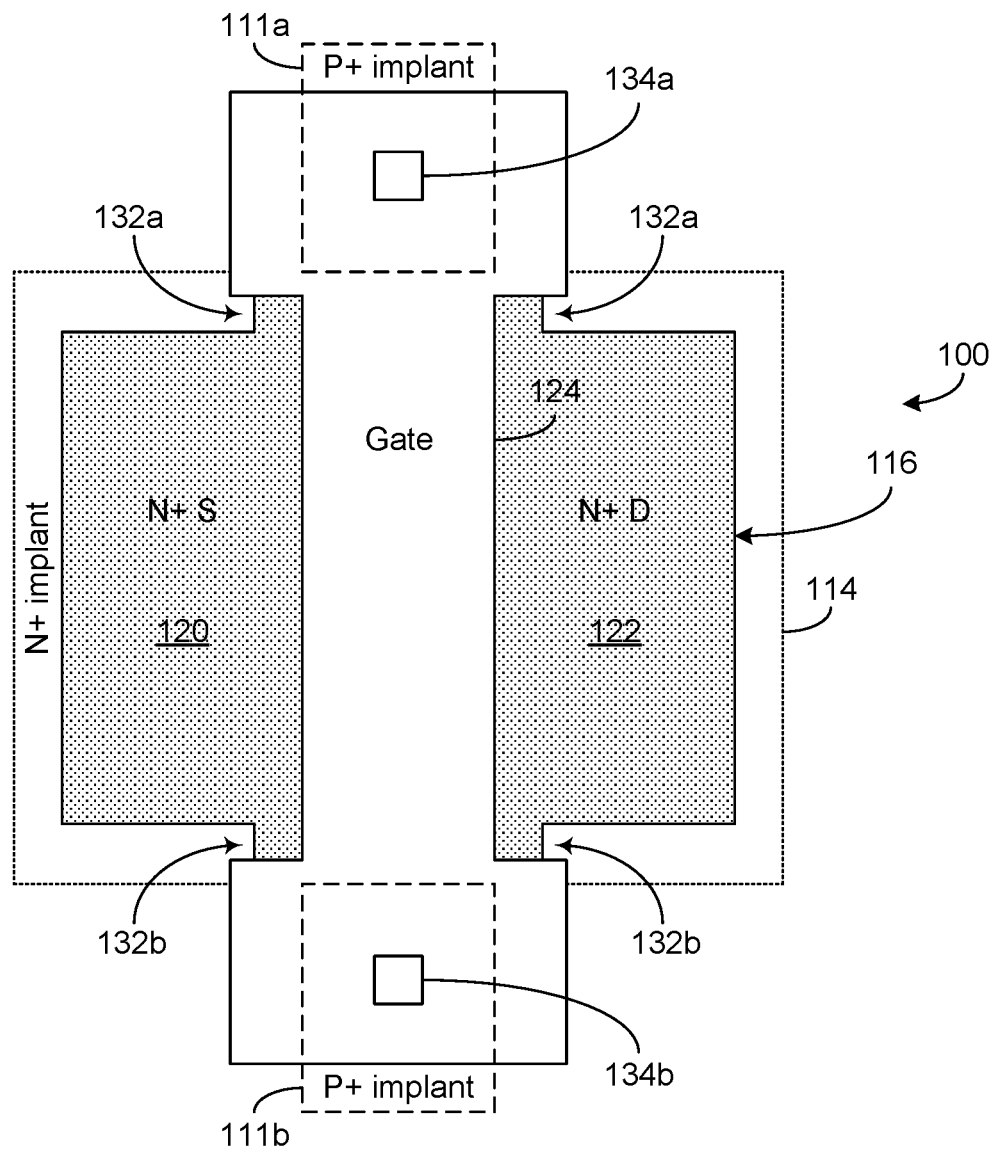
FIG. 22 shows that in some embodiments, a transistor can include an opening similar to the example of FIG. 21, for each of both ends of the gate.

In the example of FIG. 21, the opening 134 associated with the gate 124 and the body is implemented on one end of the gate structures 124. FIG. 22 shows that in some embodiments, a transistor 100 can include an opening 134 similar to the example of FIG. 21, for each of both ends of the gate 124.

In some embodiments, a transistor having one or more features as described herein can benefit by having a suppressed floating body effect. Such a suppressed floating body effect can be achieved by providing a minimum or reduced body contact with a least or reduced amount of additional parasitics such as parasitic capacitance. With such a suppressed floating body effect, advantageous features can be achieved, such as improved RF performance for RF transistors such as SOI transistors, improved performance and size associated with digital standard cells, and elimination or reduction of unwanted floating body effect associated with floating body SOI transistors.

Figure 23:
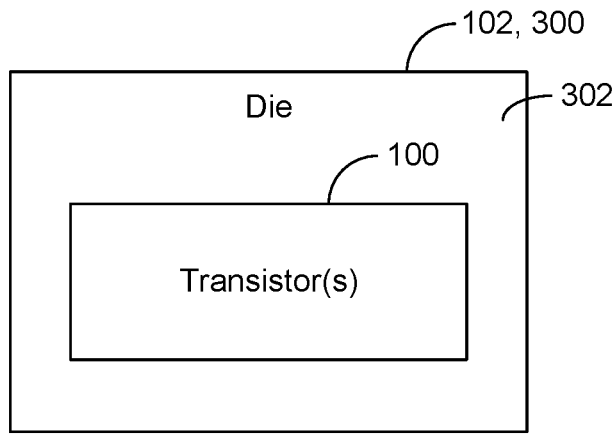
FIG. 23 shows that in some embodiments, one or more transistors as described herein can be implemented on a device such as a die.

FIG. 23 shows that in some embodiments, one or more transistors 100 having one or more features as described herein can be implemented on a device 102 such as a die 300. Such a die can include a substrate 302 such as, for example, silicon-on-insulator (SOI) substrate.

Figure 24:
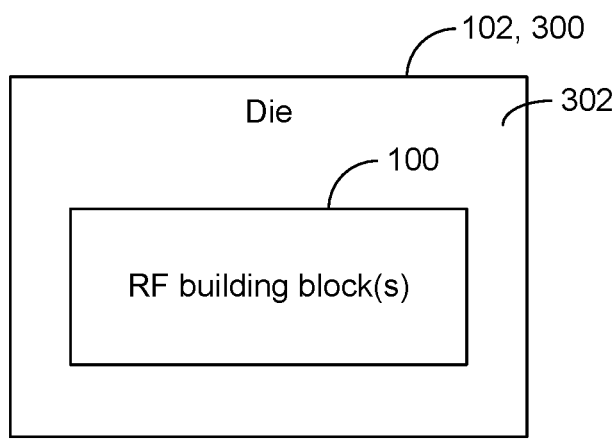
FIG. 24 shows that in some embodiments, a die/device can include one or more transistors as described herein, configured as RF building blocks.
Figure 25:
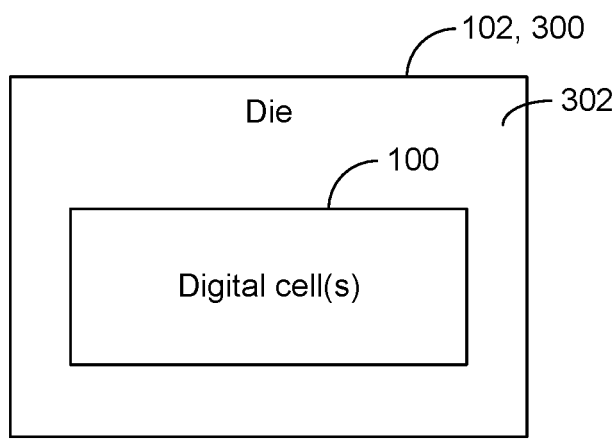
FIG. 25 shows that in some embodiments, a die/device can include one or more transistors as described herein, configured for digital applications.

FIGS. 24 and 25 show examples of the die/device 102/300 of FIG. 23. FIG. 24 shows that in some embodiments, a die/device 102/300 can include one or more transistors 100 as described herein, configured as RF building blocks. Such RF building blocks can include, for example, switching transistors, amplifying transistors, and transistors associated with RF applications (e.g., voltage-controlled oscillator, mixer, etc.).

FIG. 25 shows that in some embodiments, a die/device 102/300 can include one or more transistors 100 as described herein, configured for digital applications. For example, one or more digital cells can be implemented with transistor(s) having one or more features as described herein.

Figure 26:
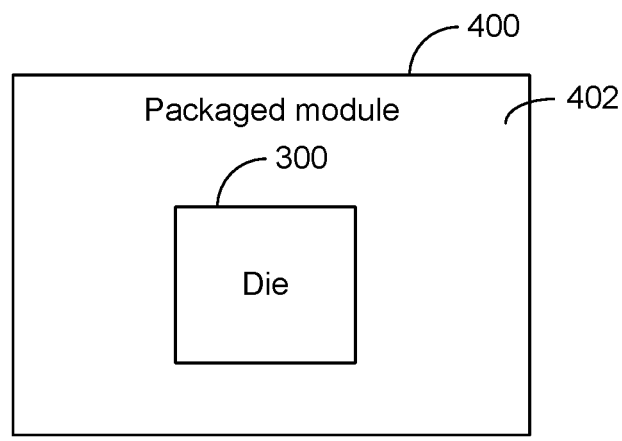
FIG. 26 shows that in some embodiments, one or more transistors as described herein can be implemented in a packaged module.

FIG. 26 shows that in some embodiments, one or more transistors having one or more features described herein can be implemented in a packaged module 400. Such a packaged module can include a packaging substrate 402 configured to receive a plurality of components. At least some of the components mounted on the packaging substrate 402 can include a die 300 such as one or more of the example die 300 of FIGS. 23-25.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 27:
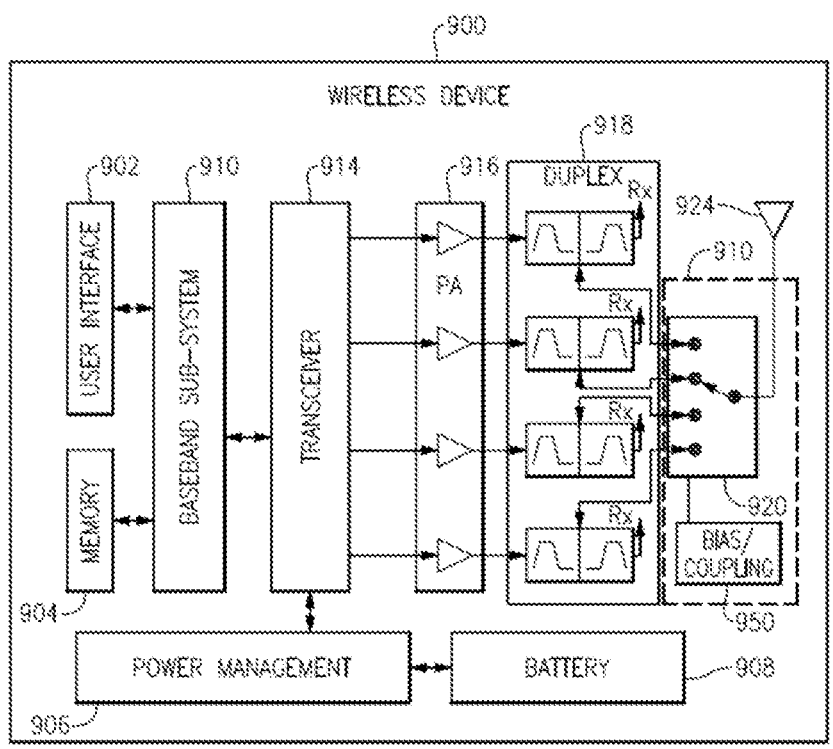
FIG. 27 depicts an example wireless device having one or more advantageous features described herein.

FIG. 27 depicts an example wireless device 900 having one or more advantageous features described herein. In the context of various transistors as described herein, a switch 920 based on such transistors can be implemented in a module 910. It will be understood that a transistor having one or more features as described herein can also be utilized in other portions of the wireless device.

In the example wireless device 900, a power amplifier (PA) assembly 916 having a plurality of PAs can provide one or more amplified RF signals to the switch 920 (via an assembly of one or more duplexers 918), and the switch 920 can route the amplified RF signal(s) to one or more antennas. The PAs 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 910.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 27, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A transistor comprising:
a source and a drain each implemented as an N+ active region;
a gate implemented relative to the source and the drain such that application of a voltage to the gate results in formation of a conductive channel between the source and the drain, the gate having a shape that includes a strip extending in a width direction and an end having an extension on the source side and perpendicular to the width direction to form an L shape; and
a body configured to provide the conductive channel upon the application of the voltage to the gate, the body including a P+ active region that butts along an interface with the N+ active region on the source side at a respective area not covered by the gate, and does not butt with the N+ active region on the drain side at a respective area not covered by the gate, the P+ active region dimensioned to extend from the interface to an edge along the width direction, both of the interface and the edge being at respective locations within the end shape along the width direction, the P+ active region further dimensioned such that the P+ active region and the strip of the gate shape do not overlap.

2. The transistor of claim 1 further comprising an insulator layer implemented under the body, such that the body is a floating body.

3. The transistor of claim 1 further comprising a gate oxide layer between the gate and the body.

4. The transistor of claim 1 wherein the P+ active region of the body butting with the N+ active region of the source results in electrical potentials of the source and the body to be approximately same.

5. The transistor of claim 1 wherein the gate has an asymmetric shape about a line along a width direction of the gate.

6. The transistor of claim 1 wherein the gate has first and second ends along a width direction of the gate.

7. The transistor of claim 6 wherein the second type active region of the body that butts with the first type active region on the source side is implemented on one of the first and second ends of the gate.

8. The transistor of claim 6 wherein the second type active region of the body that butts with the first type active region on the source side is implemented on each of the first and second ends of the gate.

* * * * *